United States Patent
Kanazawa et al.

[11] Patent Number: 6,036,797
[45] Date of Patent: Mar. 14, 2000

[54] PROCESS OF PRODUCING IC CARDS

[75] Inventors: Toyoji Kanazawa; Shingo Ichikawa, both of Sayama; Hiroyuki Kaneko, Kunitachi; Hisataro Watada, Kyoto; Toshibumi Wakayama, Tokyo, all of Japan

[73] Assignee: Citizen Watch Co., Ltd., Tokyo, Japan

[21] Appl. No.: 08/112,446

[22] Filed: Aug. 26, 1993

[30] Foreign Application Priority Data

Aug. 28, 1992 [JP] Japan .................................. 4-251999
Oct. 2, 1992 [JP] Japan .................................. 4-289525
Oct. 2, 1992 [JP] Japan .................................. 4-289526

[51] Int. Cl.$^7$ ............................. B32B 31/18; B32B 31/26
[52] U.S. Cl. ........................... 156/82; 156/268; 156/291; 156/292
[58] Field of Search ..................... 156/250, 292, 156/289, 291, 293, 70, 277, 82, 268

[56] References Cited

U.S. PATENT DOCUMENTS

| 3,508,754 | 4/1970 | Shorin ................................. 156/289 |
| 4,457,798 | 7/1984 | Hoppe et al. . |
| 4,749,432 | 6/1988 | Ando et al. .......................... 156/291 |
| 4,923,545 | 5/1990 | Dickerson ........................... 156/289 |

FOREIGN PATENT DOCUMENTS

| 0370114 | 5/1990 | European Pat. Off. . |
| 0417887 | 3/1991 | European Pat. Off. . |
| 2586886 | 3/1987 | France . |
| 2625350 | 6/1989 | France . |
| 2100669 | 1/1983 | United Kingdom . |

OTHER PUBLICATIONS

International Standard—ISO-7816-1, "Identification Cards—Integrates Circuit(s) Cards With Contacts," Jul. 1, 1987 First Edition.

*Primary Examiner*—Mark A. Osele
*Attorney, Agent, or Firm*—Townsend and Townsend and Crew LLP

[57] ABSTRACT

A process of producing an IC card, the IC card having a card substrate and an IC module embedded therein, the card substrate having a single core sheet and first and second cover films laminated over the core sheet on the opposite sides, the process including the steps of forming an adhesive layer on the inside of each of the first and second cover films except a non-adhesive area in which the IC module is to be fitted; bonding the cover films to the opposite sides of the core sheet through the adhesive layers to form the card substrate having the non-adhesive area; cutting the non-adhesive areas of the card substrate along their outer peripheries to form a cavity for receiving the IC module; fitting the IC module into the cavity; and fixedly securing the IC module to the card substrate.

8 Claims, 9 Drawing Sheets

PROCESS OF PRODUCING IC CARDS

BACKGROUND OF THE INVENTION

1. Field of the Invention

The present invention relates to a process of producing an IC card with an IC module embedded therein and more particularly to such an IC card which comprises a single core sheet, cover films formed over the core sheet on the opposite sides to form a substrate with the core sheet and an IC module embedded in a cavity that is formed in the substrate.

2. Description of the Prior Art

In recent years, various types of cards such as cashing cards, credit cards, membership cards, hospital consultation cards and other cards have broadly been used and are being essential in our daily life. At the present time, such cards are mainly in the form of a magnetic card. However, the magnetic card has its limit in functional extension since the memory capacity is too small and also problems in security and reliability. In order to overcome such problems, a multi-function IC card has been proposed which has an increased memory capacity and an improved security function and which includes CPU, memory chip and the like.

The IC card may be produced by any one of various methods. West Germany Patent No. 30299399 discloses a process of producing an IC card which has an IC module and its external connection terminals mounted and enclosed in a support to protect the IC module from a mechanical stress. The support, IC module and external connection terminals are assembled into an integral unit which is inserted in a cavity formed in the inner layer of the card before the integral unit is sealed by hot lamination. However, such a process requires any special measure for preventing the sensitive IC module from being damaged by pressure and/or temperature during the hot lamination, such as a buffer zone formed in the laminated card.

Another process has been proposed which after the card body has been laminated, it is machined by the end mill to form a blind hole into which the IC module can be fitted. This process is very difficult to provide a high-quality card since much dusts and shavings are produced and attracted by electrostatic charges inherent in the synthetic films and raises a further problem in that the IC card is produced through the increased number of working steps with degradation of the accuracy of finishing.

A further process of making an IC card with IC module has been proposed which can eliminate the shortcomings in the hot lamination process while maintaining its advantages, as in Japanese Patent Publication No. Sho 63-42314. As shown in FIGS. 1A to 1D in the accompany drawings, a multi-layer card comprises a hot laminated card body 40 including cover films 41, 42 and an intermediate layer 43 therebetween. A separation layer 45a or 45b, as formed from a mixture of solvent and silicon, is sandwiched between each of the cover films 41 or 42 and the intermediate layer 43 at a position in which an IC module 44 is to be located. Two different punch dies 47a and 47b are used to form two recesses connecting with each other and having different diameters corresponding to the respective separation layers 45a, 45b to provide a cavity receiving the IC module by punching the card body 40 until one of the punch dies 47b reaches the inner face of the lower cover film 42. The punched material portions 48a, 48b are removed with the cut separation layers 45a, 45b. Finally, the IC module 44 is fitted into the recesses 46a, 46b so formed.

Prior to filing of Japanese Patent Publication No. Sho 63-42314, Japanese Patent Publication No. Sho 52-2640 discloses a technique of forming separation layers at a cavity to receive the IC module. More particularly, such a technique forms a cavity to receive a cipher panel in a composite ID card which comprises a white-colored plastic sheet having the opposite printed sides and a separatable layer partially formed in the sheet on one side and adapted to be formed with a cipher area, and transparent plastic sheets heat-sealed to the white-colored plastic sheet on the opposite sides, by cutting the composite card along the outline of the cipher area and separating a portion of the transparent plastic sheet corresponding to the cipher area from the white-colored plastic sheet.

The prior art as disclosed in Japanese Patent Publication No. Sho 63-42314 has the following problems. As seen from FIGS. 1A to 1D, shavings of the card materials and separation layers remain in the IC module receiving cavity (46a, 46b) after it has been punched out by the punching dies 47a and 47b accurately matching the recesses 46a and 46b in cross-section and depth. This requires an additional cleaning step for removing the shavings not to provide an obstruction to the subsequent steps such as adhering step and others.

When the card body is punched out by the punching dies, one of the punching dies 47b forms a nick 49 in the outer face of the lower cover film 42. Such a nick 49 degrades the appearance of the IC card. This is more remarkable if the outer face of the cover film 42 is glossy. After the card body has been punched out by the punching dies, an outwardly convex part may be formed in the outer face of the lower cover film 42. This is an obstacle to the subsequent step, for example, to a step of adhering the IC module 44 to the card body 40. The nick 49 and convex part formed in the cover film 42 are also obstacles to the subsequent printing step. It is a matter of course that the formation of the nick and convex part is also provided by any pressing force sufficient to deform a thin cover film.

SUMMARY OF THE INVENTION

It is therefore an object of the present invention to provide a process which can inexpensively produce an IC card improved in appearance and quality and increased in reliability.

To this end, the present invention provides a process of producing an IC card, said IC card comprising a card substrate and an IC module embedded therein, said card substrate comprising a single core sheet and first and second cover films laminated over the core sheet on the opposite sides, said process comprising the steps of forming an adhesive layer on the inside of each of said first and second cover films except a non-adhesive area in which said IC module is to be fitted, bonding said cover films to the opposite sides of said core sheet through said adhesive layers to form said card substrate having said non-adhesive area, cutting the non-adhesive areas of said card substrate along their outer peripheries to form a cavity for receiving said IC module, fitting said IC module into said cavity, and fixedly securing said IC module to said card substrate.

In another aspect of the present invention, the IC card producing process is characterized by that said IC module comprises a main body including an IC chip and a circuit substrate fixedly mounted on the top of said main body and having a cross-sectional area lager than that of said main body, said circuit substrate including external connection terminals and by that said cavity comprises a first recess for receiving the circuit substrate of said IC module and a second recess connecting to said first recess and formed in said core sheet to have a cross-sectional area smaller than that of said first recess, said second recess being adapted to receive the main body of said IC module.

In still another aspect of the present invention, the IC card producing process is characterized by that the cutting of at least one non-adhesive area in said card substrate is carried out by a rotary grooving cutter.

In a further aspect of the present invention, the IC card producing process is characterized by that the cutting of at least one non-adhesive area in said card substrate is carried out by a punching tool and by that after said at least one non-adhesive area has been punched out, the opposite cover film is thermally treated at a temperature equal to or higher than the softening temperature of said cover film at a position corresponding to said recesses.

In a further aspect of the present invention, the IC card producing process is characterized by that it further comprises the step of previously roughening the outer side of one of said cover films and by that the cutting of at least one non-adhesive area in said card substrate is carried out by punching said card substrate from its side opposite to said roughened cover film.

As will be apparent from the foregoing, the adhesive layers are formed on the inner sides of the first and second cover films except the non-adhesive areas corresponding to the IC module to be received therein and the card substrate is punched out along the outlines of said non-adhesive areas to form a cavity for receiving the IC module. Therefore, the process of the present invention requires no step of removing any unnecessary matter such as dusts, shavings, adhesive and others and can inexpensively produce an IC card improved in reliability, appearance and quality with an improved productivity.

The above-mentioned and other objects, features and advantages of the present invention will fully be understood by a person skilled in the art from the following description of some preferred embodiments in connection with the accompanying drawings.

BRIEF DESCRIPTION OF THE DRAWINGS

FIGS. 7A, 7B, and 7C are a cross-sectional view and fragmentary plan view illustrating a step of forming a cavity in the card substrate.

DETAILED DESCRIPTION OF THE PREFERRED EMBODIMENTS

Figure 1A:
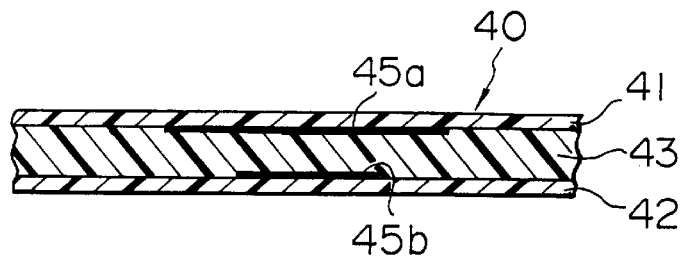
FIGS. 1A, 1B, 1C, and 1D are cross-sectional views illustrating the prior art process of producing an IC card.
Figure 1B:
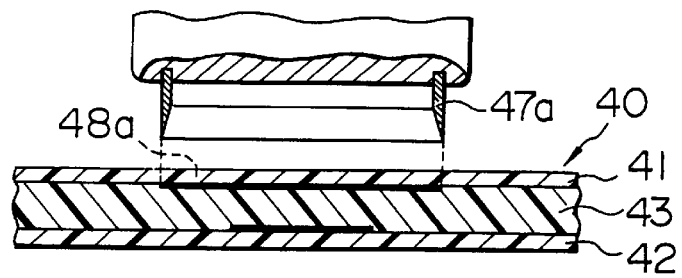
Figure 1C:
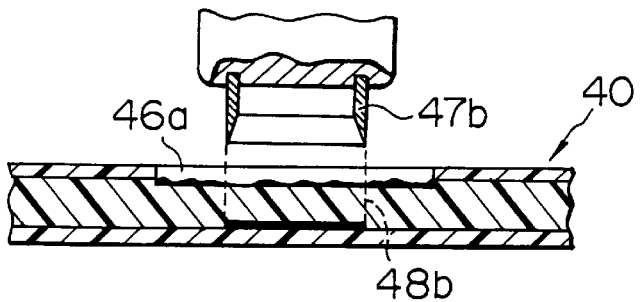
Figure 1D:
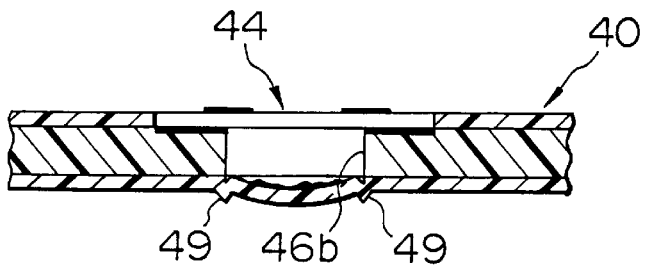

The present invention will now be described in more detail with reference to several preferred embodiments thereof illustrated in the accompanying drawings.

Referring now to FIGS. 2A–2C and 3A–3C, there is shown an IC card 10 which comprises a rectangular core sheet 1 made of polyvinyl chloride or the like adapting to the international standards and two first and second cover films 2, 3 bonded to the core sheet 1 on the opposite sides through adhesive. The IC card 10 also comprises a cavity formed therein which receives an IC module 4 comprising a circuit substrate 4a having external connection terminals and a main body 4b including an IC chip fixedly mounted on the underside of the circuit substrate. As seen from FIG. 2A, any suitable means such as roll printing or the like is used to form a hot-melt adhesive layer 6 on the inner side of one of the cover film 2 in its area other than a non-adhesive area 5 corresponding to the position of the circuit substrate 4a to be received and to form a hot-melt adhesive layer 8 on the inner side of the other cover film 3 in its area other than a non-adhesive area 7 corresponding to the position of a recess 11 that will be formed in the core sheet 1 to receive the main body 4b of the IC module 4.

Figure 2A:
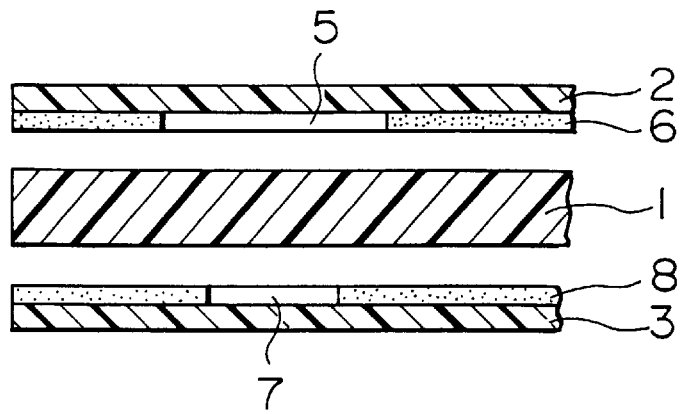
FIGS. 2A, 2B, and 2C are cross-sectional views illustrating the first embodiment of an IC card producing process constructed in accordance with the present invention.
Figure 2B:
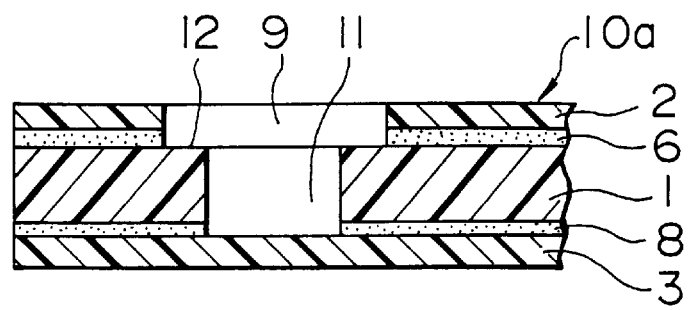

As shown in FIG. 2B, the cover films 2 and 3 are then bonded to the core sheet 1 on the opposite sides at a temperature ranging between about 100!n and about 120!n under pressure with the non-adhesive areas 5 and 7 being aligned with each other. As the temperature in the assembly decreases, the adhesive layers is set to form an integral lamination, that is, a card substrate 10a. The above range of temperature will not adversely affect the core sheet 1 of polyvinyl chloride or the like.

Figure 3A:
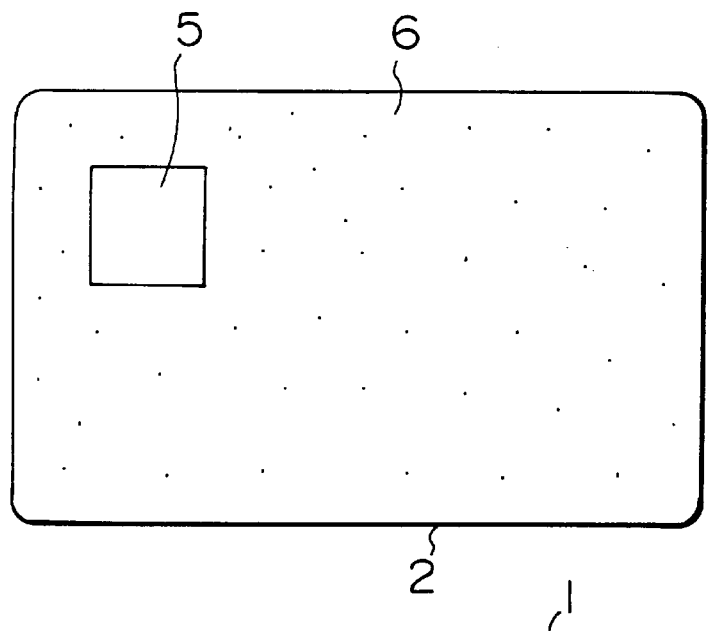
FIGS. 3A, 3B, and 3C are plan views respectively illustrating a single core sheet and first and second cover films laminated over the core sheet on the opposite sides, all of which defines a card substrate used in the first embodiment.
Figure 3B:
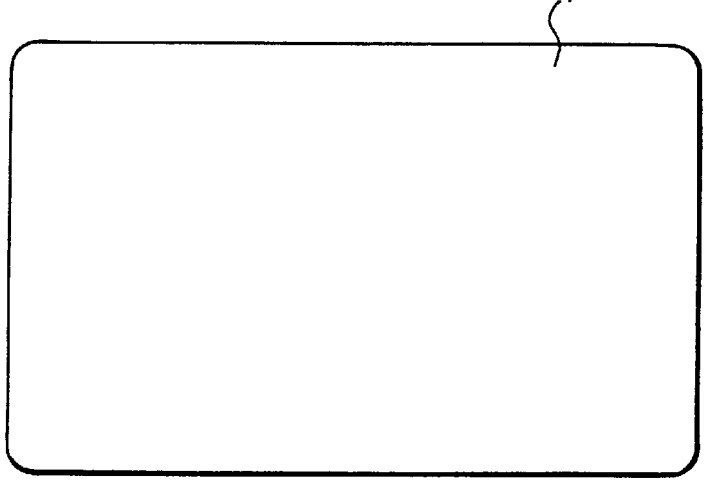
Figure 3C:
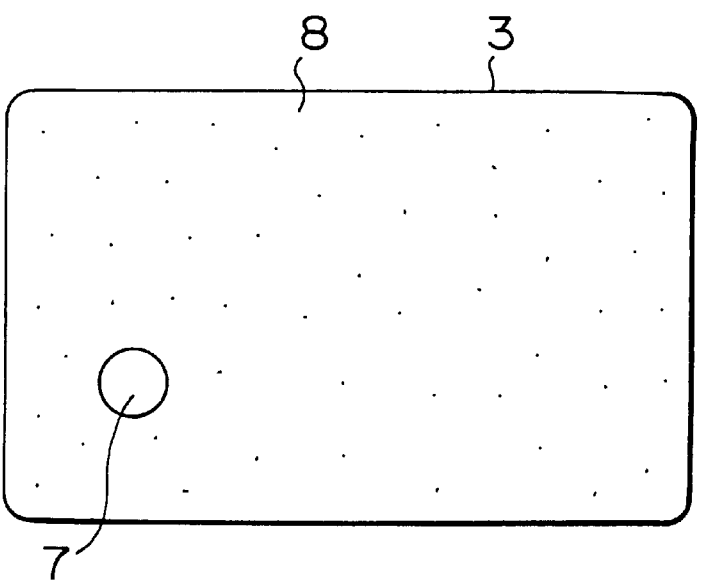
Figure 4:
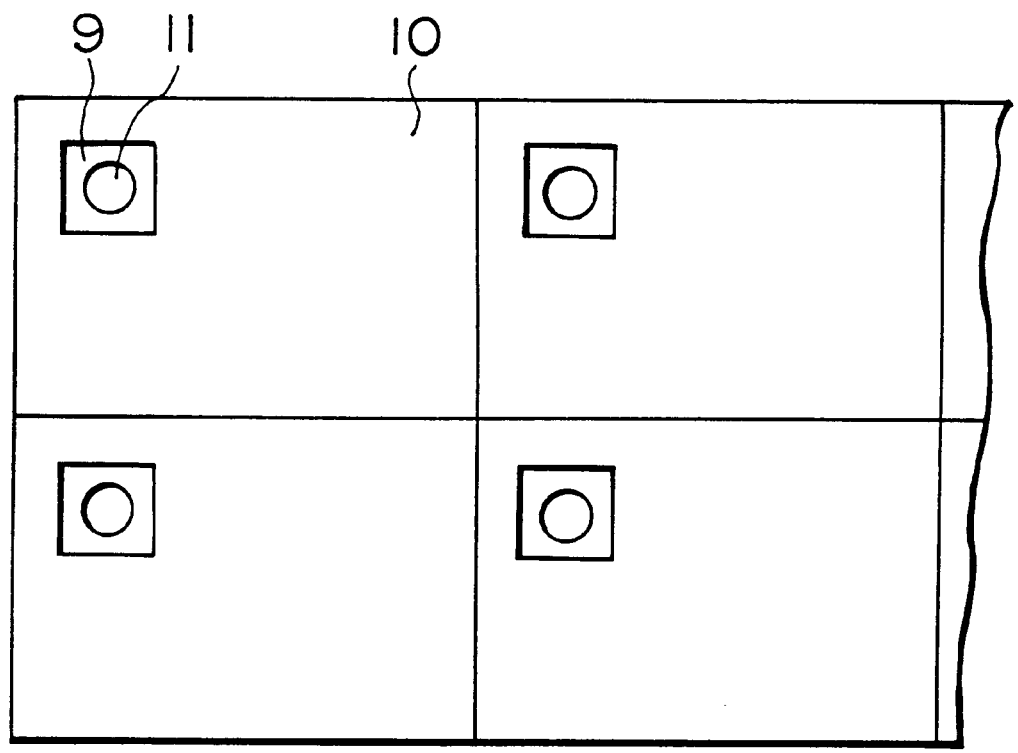
FIG. 4 is a plan view illustrating a process of simultaneously producing a number of IC cards according to the first embodiment.

As shown in FIGS. 3A to 3C, the non-adhesive area 5 on the inner side of the cover film 2 is of a square configuration while the non-adhesive area 7 on the inner side of the cover film 3 is of a circular configuration.

When it is to form a stepped cavity as shown in FIG. 2B, the cover film 2 is first cut or punched at its part corresponding to the non-adhesive area 5 to form a recess 9 for receiving the circuit substrate 4a of the IC module 4. The core sheet 1 is then cut or punched at its part corresponding to the non-adhesive area 7 on the cover film 3 to form another recess 11 for receiving the main body 4b of the IC module 4, the recess 11 being thus connected to the recess 9. The plug-like parts of the material formed by punching the non-adhesive layers 5 and 7 can easily be removed since these plug-like parts are not bonded to the core sheet 1. The stepped cavity so formed, that is, the recesses 9 and 11 for respectively receiving the circuit substrate and main body 4a, 4b will not contain any unnecessary matter such as dusts, shavings, debris of adhesive. Thus, the process requires no cleaning step for removing the unnecessary matter and can thus be simplified.

Figure 2C:
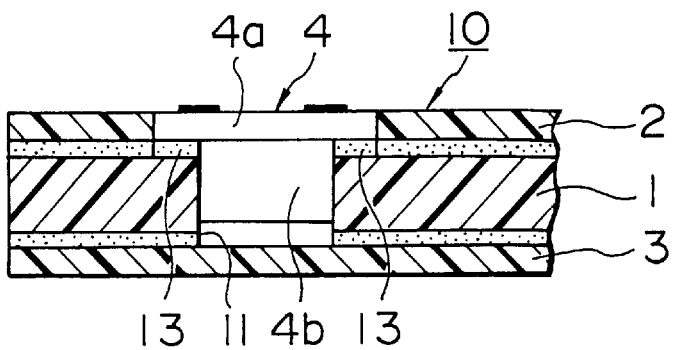

As shown in FIG. 2C, an adhesive 13 is applied to the bottom step 12 of the recess 9. The IC module 4 is then fixedly mounted in the card substrate 10a by bonding the bottom of the circuit substrate 4a to the step 12 of the recess 9 through the adhesive 13. In such a manner, the IC module 4 can very steadily mounted in the cavity (9 and 11) of the card substrate 10a.

Although a single IC card has been described to be produced according to the first embodiment, a plurality of IC cards may simultaneously be produced from a single large-sized substrate comprising a core sheet and cover films made of polyvinyl chloride or the like. The large-sized substrate may be worked until the step of forming stepped cavities are carried out. After the individual IC cards have been cut out from the large-sized substrate, an IC module 4 may be mounted in the stepped cavity of each of the IC cards, as shown in FIG. 2C.

The first embodiment of the present invention is characterized by that since the adhesive layers are formed on the inner sides of the first and second cover films 2, 3 except the non-adhesive areas 5, 7 corresponding to the respective recesses for receiving the circuit substrate and main body 4a, 4b of the IC module 4, the plug-like material portions cut out from the first and second cover films 2, 3 when the stepped cavity (9 and 11) is formed in the card substrate 10a can very easily be removed from the card substrate 10a because they are not bonded thereto. The hot-melt adhesive layers formed on the cover films by roll printing or the like will not adversely affect the core sheet 1 since the temperature required to seal the hot-melt adhesive is relatively low, that is, between about 100° C. and about 120° C.

Figure 5A:
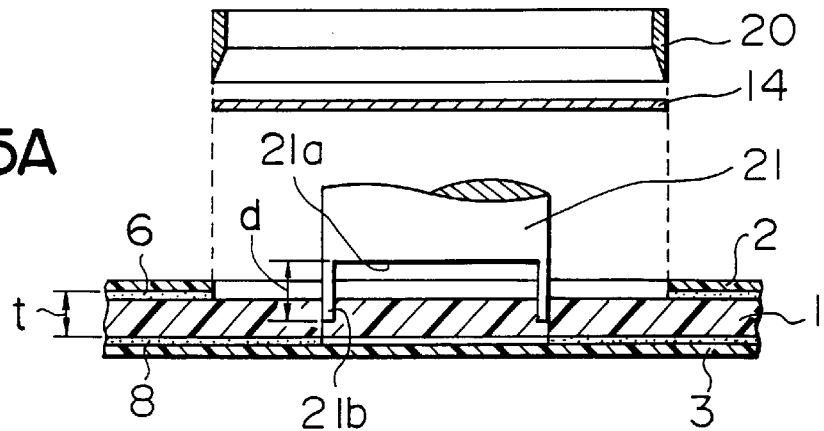
FIGS. 5A, 5B, and 5C are cross-sectional views illustrating the second embodiment of an IC card producing process constructed in accordance with the present invention.
Figure 5B:
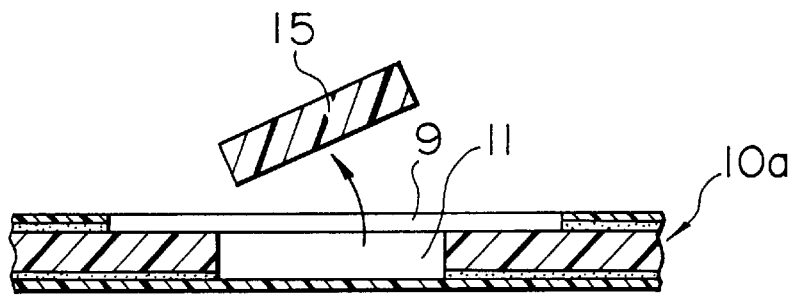
Figure 5C:
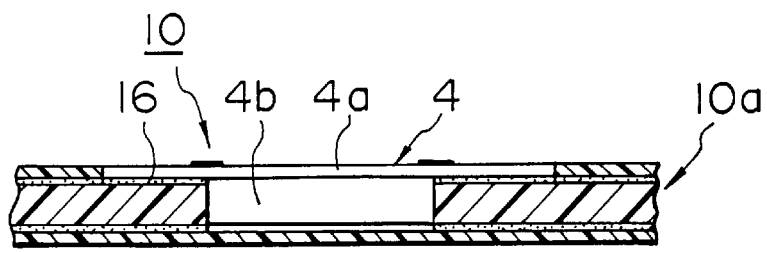

A cutting step of forming the recesses 9 and 11 in the card substrate 10a to receive the IC module 4 is shown in FIGS. 5A to 5C with the second embodiment of a process constructed in accordance with the present invention.

Figure 6:
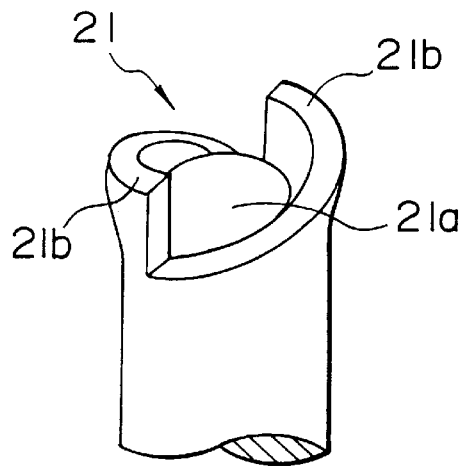
FIG. 6 is a perspective view of a rotary cutter used in the second embodiment.

As shown in FIG. 5B, the recess 9 is first formed in one of the cover films 2 at its part corresponding to the non-adhesive area 5 by punching it by the use of a punching tool which has a cutter 20 matching the cross-section and depth of the recess 9. A plug-like material portion 14 is cut out and removed from the cover film 2 by the punching tool 20. Subsequently, the core sheet 1 is cut by a rotary cutter 21 corresponding to the external diameter of the other recess 11. As best seen from FIG. 6, the rotary cutter 21 has a cutting edge 21b formed thereon at the outer periphery and a central relief portion 21a having no cutting edge. As shown in FIG. 5A, the axial distance between the tip of the cutting edge 21b and the relief portion 21a, that is, the length d of the cutting edge 21b is larger than the thickness t of the core sheet 1. When the core sheet 1 is cut to form a ring-like groove by the rotary cutter 21, the amount of cut material and shavings can be reduced with improvements in machinability and shaving discharge and without application of any force to the opposite cover film 3. As the rotary cutter 21 reaches the non-adhesive area 7 on the inner side of the opposite cover film 3, a plug-like material part 15 is cut out from the core sheet 1 at an area corresponding to the recess 11. The plug-like material part 15 is easily removed as the rotary cutter 21 rotates.

As shown in FIG. 5C, the recesses 9 and 11 have clean and 1 2 flat bottoms without any distortion such as nick or the like after the plug-like material part 15 has been removed. An adhesive 16 is then applied to the bottom or step 12 of the recess 9. The IC module 4 is then mounted in and bonded to the cavity (9 and 11) so formed in the card substrate 10a through the adhesive 16.

In such a manner, the IC module 4 can extremely steadily be mounted in the card substrate 10a to produce an IC card 10 improved in reliability, appearance and quality.

Figure 7A:
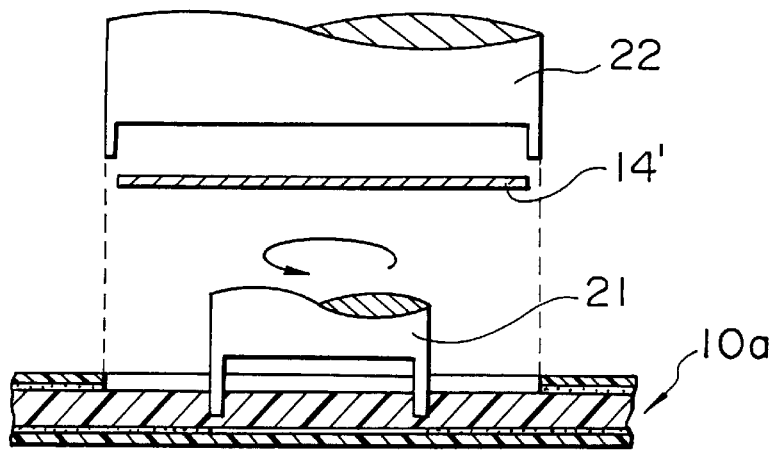
Figure 7B:
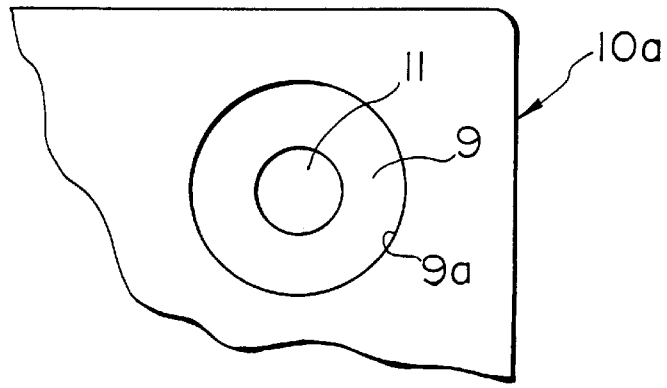

FIGS. 7A and 7B show another technique of forming a stepped cavity in the card substrate 10a without need for punching. A recess 9 for receiving the circuit substrate 4a of the IC module 4 is first cut out in one of the cover films by the use of a rotary cutter 22 having an external diameter corresponding to the external diameter of the recess 9, the resulting plug-like material part 14' being removed. This cutting step is carried out under the same condition as in the ring-like groove cut for forming the aforementioned recess 11. By using two different rotary cutters to cut a stepped cavity (9 and 11) in the above manner, the card substrate 10a can have flat surfaces without any distortion such as nick or the like. The formation of the recess 9 provides a ring-like groove 9a, as shown in FIG. 7B.

Such a technique is characterized by that after non-adhesive areas have been formed between the core sheet 1 and the cover films 2, 3 at the respective areas corresponding to the recesses 9 and 11 to be formed in the card substrate 10a, the recesses 9 and 11 are formed by cutting a ring-like groove in the core sheet 1 by the use of the two different rotary cutters 21 and 22 corresponding to the outlines of the recesses 9 and 11. Thus, any force will not be applied against the opposite cover film 3 of the card substrate 10a to produce any distortion such as nick or the like.

Figure 8:
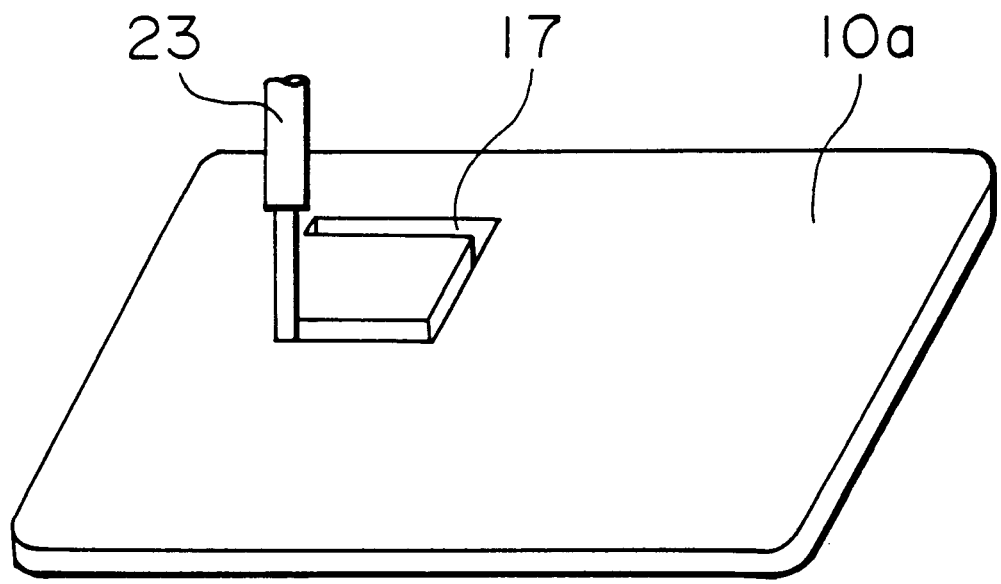
FIG. 8 is a schematic and perspective view illustrating another step of forming a cavity in the card substrate.

The two rotary cutters may be replaced by an end mill 23 having a thin rotary cutting edge as shown in FIG. 8. The end mill 23 may be used to cut a groove 17 in the card substrate along the outline of an IC module receiving recess to be formed.

Figure 9A:
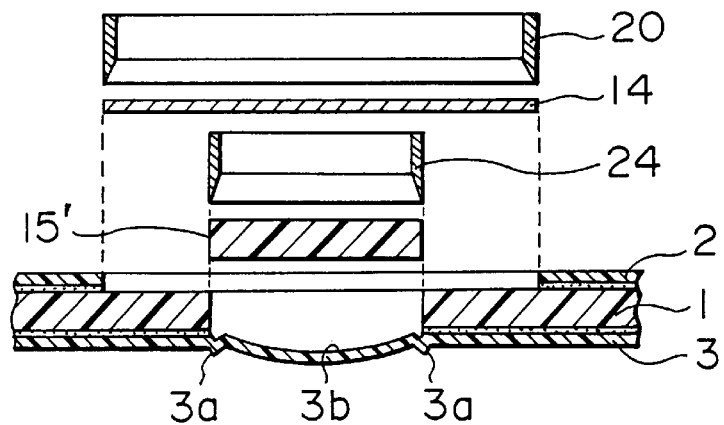
FIGS. 9A, 9B, and 9C are cross-sectional views illustrating the third embodiment of an IC card producing process constructed in accordance with the present invention.
Figure 9B:
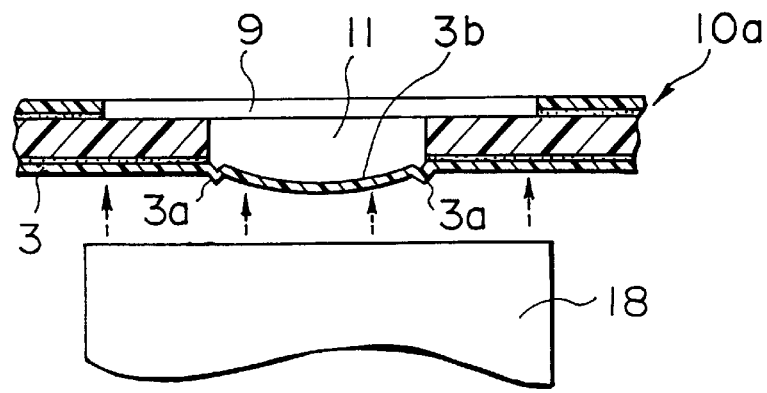
Figure 9C:
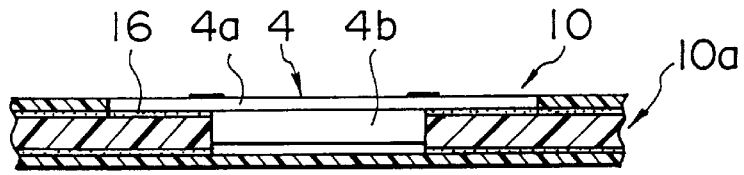

FIGS. 9A to 9C show the third embodiment of an IC card producing process constructed in accordance with the present invention. As shown in FIG. 9B, the recesses 9 and 11 are sequentially formed in one of the cover films 2 and the core sheet 1 at their parts corresponding to the non-adhesive areas 5 and 7 by punching them by the use of two punching tools which respectively have cutters 20 and 24 matching the recesses 9 and 11 in cross-section and depth. The resulting plug-like material parts 14 and 15' are removed from the cover film and core sheet 2 and 1, respectively. After being punched, the thin cover film 3 on the opposite side of the card substrate 10a will have a central concave portion 3b at an area at which the plug-like material part 15' is punched out and removed, as shown in FIG. 9B. When the recess 11 is formed in the card substrate 10a, it is difficult to avoid the outer face of the cover film 3 from being distorted to create a nick 3a.

As shown in FIG. 9B, the card substrate 10a is thermally treated from the lower side thereof over the position corresponding to the recesses 9 and 11 at a temperature equal to or higher than the softening point of the cover film 3, for example, a temperature ranging between about 80!n and about 120!n. More particularly, a hot air generator 18 may be used to apply a flow of hot air to the cover film 3 in a direction of arrow so that the nick 3a and outwardly convex part 3b thereof will be heated without contact of the hot air generator 18. This can shrink those areas of the cover film 3 to completely remove any distortion such as nick 3a and outwardly convex part 3b in the outer side of the cover film 3. In such a manner, the lower surface of the card substrate 10a will not be damaged by the hot air generator 18, providing a stepped cavity that has a clean and flat bottom.

As shown in FIG. 9C, an adhesive 16 is then applied to the bottom or step 12 of the recess 9. The IC module 4 is then mounted in and bonded to the cavity (9 and 11) so formed in the card substrate 10a through the adhesive 16.

In such a manner, the IC module 4 can extremely steadily be mounted in the card substrate 10a to produce an IC card 10 improved in reliability, appearance and quality.

Figure 10A:
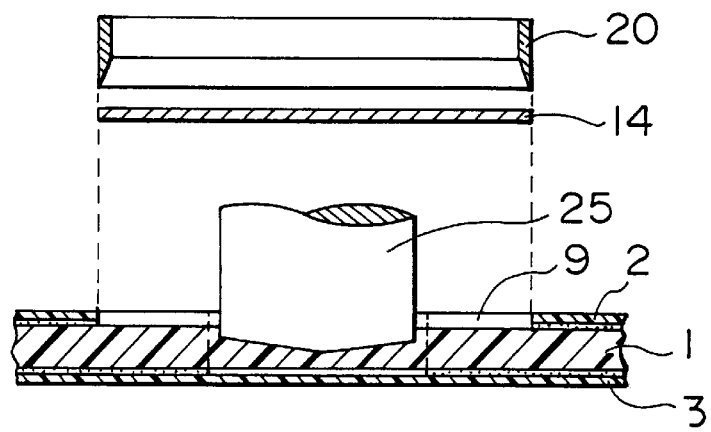
FIGS. 10A and 10B are cross-sectional views illustrating still another step of forming a cavity in the card substrate.
Figure 10B:
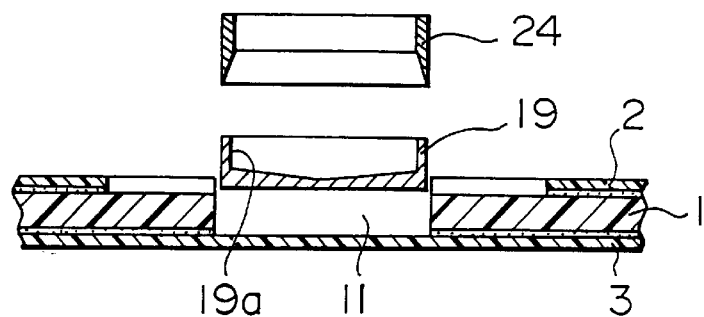

Referring to FIGS. 10A and 10B, a further technique of forming a stepped cavity (9 and 11) for receiving the IC module 4 in the card substrate 10a. In FIG. 10A, the formation of the recess 9 for receiving the circuit substrate 4a of the IC module 4 in the card substrate 10a is similar to that of the third embodiment and will not further described herein. After the recess 9 has been formed, however, a drill 25 having an external diameter smaller than the external diameter of the punching die 24 is used to cut the card substrate 10a up to a depth not reaching the inner side of the opposite cover film 3 to form a preparatory hole 19a in the core sheet 1. The core sheet 1 is further punched out around the preparatory hole 19a by the punching die 24 matching the recess 11 to be formed in cross-section and depth. The resulting cup-like material part 19 can easily be removed from the cover film 3. The recess 11 so formed for receiving the main body 4b of the IC module 4 has a clean and flat bottom since the formation of the preparatory hole 19a reduces a machining allowance required by the punching step and also a force applied to the opposite cover film 3. Even if any distortion such as nick or other deformation is created in the cover film 3, the local heat treatment is carried out as by the hot air generator to remove the distortion from the cover film 3.

Figure 11:
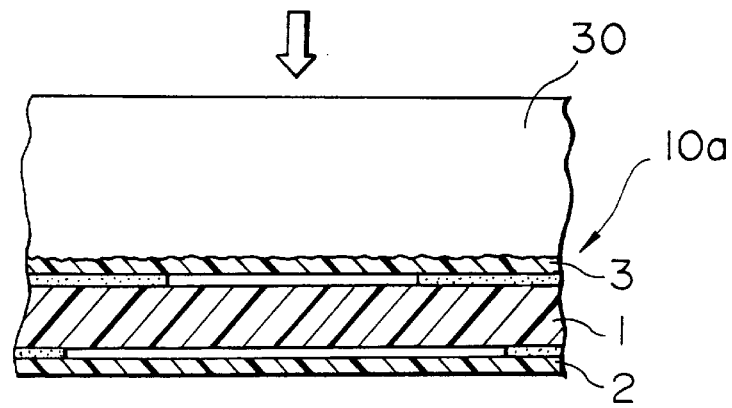
FIG. 11 is a view illustrating a step of roughening the card substrate on one side.

As shown in FIG. 11, the outer face of the cover film 3 in the card substrate 10a may be roughened or matted into a satin-like or wrinkle pattern prior to formation of the stepped cavity (9 and 11). For example, a plate 30 formed on one side with a satin-like or wrinkle pattern is heated up to a predetermined temperature (e.g. about 140!n) and then pressed against the outer side 31 of the cover film 3 in the card substrate 10a. The pattern is transferred from the plate 30 to the outer face 31 of the cover film 3 so that it will not be glossy. Even if any distortion is created on the outer roughened surface 31 of the cover film 3 or card substrate 10a when the card substrate 10a is punched out by the punching tool to form the recess 11 in the card substrate 10a, such a distortion will be inconspicuous since the outer face 31 of the cover film 3 is not glossy. In combination of the roughening step with the local heat treatment, the quality in the lower surface of the card substrate 10a can be secured.

If the recess 11 for receiving the main body 4b of the IC module 4 is formed into a circular configuration in the card substrate 10a, it is advantageous for production and service life of the punching die 24. This can prevent the nick on the cover film 3 from being increased and also adapts to the confinement of the main body 4b of the IC module 4.

The present embodiment of the present invention is characterized by that the cover film is heat treated at a temperature equal to or higher than the softening point of that cover film to remove any distortion formed when the recess is formed in the card substrate, as described. On the heat treatment, the cover film will locally be heated by the flow of hot air without contact with the heating means. Since the preparatory hole is formed prior to formation of the recess, the machining allowance is less required. The outer face of the cover film is roughened to be not glossy so that the distortion will be inconspicuous. When such roughing is combined with the heat treatment, the quality in the lower face of the card substrate can be secured. When the non-adhesive areas are formed between the core sheet and the cover films at the positions corresponding to the recesses to be formed, the unnecessary matters or material parts formed on punching can easily be separated and removed from the card substrate. If the recesses are of circular configuration, it adapts to the punching operation and the confinement of the IC module.

Although the preferred embodiments have been described as to the IC card containing the IC module, the present invention is not limited to it and may similarly be applied to ID cards and other cards in which a photograph, print, ID referencing matter are embedded.

What is claimed is:

1. A process of producing an IC card, said IC card comprising a card substrate and an IC module embedded therein, said card substrate comprising a single core sheet and first and second cover films laminated over the core sheet on the opposite sides, said process comprising the steps of:
   (a) forming an adhesive layer on the inside of each of said first and second cover films while maintaining non-adhesive areas, formed at respective inner surfaces of said first and second cover films in which said IC module is to be fitted, free of any adhesive;
   (b) assembling said card substrate by bonding said cover films to the opposite sides of said core sheet by the interposition of said adhesive layers and hardening said adhesive layers;
   c) cutting said first cover film and said core sheet along the outer peripheries of said non-adhesive areas to form a cavity, wherein the cutting is carried out by a rotary cutter which includes a cutting edge formed therein along the outer periphery and a central relief portion having no cutting edge and formed in said rotary cutter about the rotational axis thereof; and
   (d) fitting said IC module into said cavity and fixedly securing said IC module to said card substrate.

2. A process as defined in claim 1 wherein the cutting edge of said rotary cutter is formed only on part of the outer periphery of said rotary cutter.

3. A process as defined in claim 1 wherein the length of said cutting edge along the rotational axis of said rotary cutter is larger than the thickness of said core sheet.

4. A process of producing an IC card said IC card comprising a card substrate and an IC module embedded therein, said card substrate comprising a single core sheet and first and second cover films laminated over the core sheet on the opposite sides, said process comprising the steps of:
   (a) forming an adhesive layer on the inside of each of said first and second cover films while maintaining non-adhesive areas, formed at respective inner surfaces of said first and second cover films in which said IC module is to be fitted, free of any adhesive;
   (b) assembling said card substrate by bonding said cover films to the opposite sides of said core sheet by the interposition of said adhesive layers and hardening said adhesive layers;
   c) cutting said first cover film and said core sheet along the outer peripheries of said non-adhesive areas, respectively, to form a cavity for receiving said IC module, wherein the cutting is carried out by a punching tool by using a rotary cutter having a preparatory hole in said card substrate and subsequently by using another punching tool having a cross-sectional configuration corresponding to that of said cavity to punch said cavity in said card substrate; and
   (d) fitting said IC module into said cavity and fixedly securing said IC module to said card substrate.

5. A process of producing an IC card, said IC card comprising a card substrate and an IC module embedded therein, said card substrate comprising a single core sheet and first and second cover films laminated over the core sheet on the opposite sides, said process comprising the steps of:

(a) forming an adhesive layer on the inside of each of said first and second cover films while maintaining non-adhesive areas, formed at respective inner surfaces of said first and second cover films in which said IC module is to be fitted, free of any adhesive;

(b) assembling said card substrate by bonding said cover films to the opposite sides of said core sheet by the interposition of said adhesive layers and hardening said adhesive layers;

(c) cutting said first cover film and said core sheet along the outer peripheries of said non-adhesive areas, respectively, to form a cavity, for receiving said IC module wherein the cutting is carried out by a punching tool;

(d) thermally treating the opposite cover film at a temperature equal to or higher than the softening temperature of said cover film at a position corresponding to said cavity; and (e) fitting said IC module into said cavity and fixedly securing said IC module to said card substrate.

6. A process as defined in claim 5 wherein the thermal treatment of said cover film is carried out by locally heating said cover film without contact with a heating means.

7. A process as defined in claim 5 wherein the thermal treatment of said cover film is carried out by locally heating said cover film with a flow of hot air.

8. A process of producing an IC card, said IC card comprising a card substrate and an IC module embedded therein, said card substrate comprising a single core sheet and first and second cover films laminated over the core sheet on the opposite sides, said process comprising the steps of:

(a) forming an adhesive layer on the inside of each of said first and second cover films while maintaining non-adhesive areas, formed at respective inner surfaces of said first and second cover films in which said IC module is to be fitted, free of any adhesive;

(b) assembling said card substrate by bonding said cover films to the opposite sides of said core sheet by the interposition of said adhesive layers and hardening said adhesive layers;

c) roughening the outer side of one of said cover films (d) after said roughening, cutting said first cover film and said core sheet along the outer peripheries of said non-adhesive areas, respectively, to form a cavity, for receiving said IC module wherein the cutting is carried out by punching said card substrate with a punching tool from its side opposite to said roughened cover film; and (d) fitting said IC module into said cavity and fixedly securing said IC module to said card substrate.

* * * * *